(12) United States Patent
Chiu et al.

(10) Patent No.: US 7,745,853 B2
(45) Date of Patent: Jun. 29, 2010

(54) MULTI-LAYER STRUCTURE WITH A TRANSPARENT GATE

(75) Inventors: Hsien-Chin Chiu, Taipei (TW); Liann-Be Chang, Dasi Township,Taoyuan County (TW); Che-Kai Lin, Taipei (TW)

(73) Assignee: Chang Gung University, Taoyuan county (TW)

( * ) Notice: Subject to any disclaimer, the term of this patent is extended or adjusted under 35 U.S.C. 154(b) by 66 days.

(21) Appl. No.: 12/141,133

(22) Filed: Jun. 18, 2008

(65) Prior Publication Data

US 2009/0315077 A1 Dec. 24, 2009

(51) Int. Cl.
*H01L 29/778* (2006.01)

(52) U.S. Cl. .............. 257/194; 257/E29.246; 257/E21.403; 257/E21.407

(58) Field of Classification Search ............ 438/92, 438/93, 172, FOR. 179; 257/E29.246, E21.403, 257/E21.407, 194
See application file for complete search history.

(56) References Cited

U.S. PATENT DOCUMENTS

| | | | | |
|---|---|---|---|---|
| 4,821,093 A * | 4/1989 | Iafrate et al. | ................ | 257/194 |
| 5,319,223 A * | 6/1994 | Fujita et al. | .................. | 257/190 |
| 5,371,388 A * | 12/1994 | Oda | ........................... | 257/194 |
| 5,596,211 A * | 1/1997 | Onda et al. | ................... | 257/194 |
| 5,621,228 A * | 4/1997 | Ando | ........................ | 257/192 |
| 5,633,516 A * | 5/1997 | Mishima et al. | ............. | 257/190 |
| 5,668,387 A * | 9/1997 | Streit et al. | .................. | 257/192 |
| 6,049,097 A * | 4/2000 | Hida | .......................... | 257/192 |
| 6,057,566 A * | 5/2000 | Eisenbeiser et al. | ......... | 257/194 |
| 6,593,603 B1 * | 7/2003 | Kim et al. | .................... | 257/194 |
| 6,800,878 B2 * | 10/2004 | Nambu et al. | ................ | 257/194 |
| 6,924,218 B2 * | 8/2005 | Marsh et al. | ................. | 438/570 |
| 6,992,319 B2 * | 1/2006 | Fahimulla et al. | ............. | 257/20 |
| 2004/0201076 A1 * | 10/2004 | Shur et al. | .................... | 257/462 |
| 2005/0167002 A1 * | 8/2005 | Ghyselen et al. | ............... | 148/33 |
| 2008/0001173 A1 * | 1/2008 | Kiewra et al. | ............... | 257/194 |

* cited by examiner

*Primary Examiner*—George Fourson

(57) ABSTRACT

A multi-layer structure with a transparent gate includes a MHEMT device structure comprising a GaAs substrate, a Schottky layer and a cap layer formed on the Schottky layer; a transparent gate formed on the Schottky layer being an indium tin oxide, ITO; and a drain and a source formed on the cap layer. Moreover, the MHEMT device structure includes a graded buffer, a buffer layer, a first spacer layer, a channel layer, and a second spacer layer formed between the GaAs substrate and the Schottky layer in a stacked fashion. The multi-layer structure is a transparent gate HEMT employing indium tin oxide which can make HEMT more sensitive to the light wave.

8 Claims, 8 Drawing Sheets

MULTI-LAYER STRUCTURE WITH A TRANSPARENT GATE

BACKGROUND OF THE INVENTION

1. Field of Invention

The present invention relates to high electron mobility transistors (HEMT) and more particularly to transparent-gate HEMT employing indium tin oxide which can make HEMT more sensitive to the light wave.

2. Description of Related Art

In recent years, with the increasing of the mobile communication demand, high frequency devices such as high electron mobility transistor (HEMT), and heterojunction bipolar transistor (HBT) have a significant development. With respect to HEMT, pseudomorphic HEMT (PHEMT) and lattice match HEMT (LMHEMT) have better performance on current gain cut-off frequency ($f_T$) and maximum oscillation of frequency ($f_{max}$) Because InGaAs in the InP substrate has higher electron mobility and higher peak electron velocity, LMHEMT shows better high frequency performance than PHEMT. Moreover, because the InP substrate is very expensive and fragile, the fabrication of the monolithic microwave integrated circuit (MMIC) is difficult.

In general, to use materials of different lattice constants is to place a buffer layer between them. This is done in the MHEMT or metamorphic HEMT, an advancement of the PHEMT developed in recent years. In the buffer layer is made of AlInAs, with the indium concentration graded so that it can match the lattice constant of both the GaAs substrate and the GaInAs channel. This brings the advantage that practically any Indium concentration in the channel can be realized, so the devices can be optimized for different applications (low indium concentration provides low noise; high indium concentration gives high gain). The MHEMT device can have high frequency performance close to InP LMHEMT. The MHEMT device can save fabrication cost and make fabrication process easier.

Moreover, the HEMT is also called a heterostructure field effect transistor (HFET). The HEMT is a field effect transistor (FET) incorporating a junction (i.e. a heterojunction) between two materials with different band gaps as the channel instead of a doped region. The heterojunction created by different band-gap materials forms a quantum well in the conduction band on the GaAs side where the electrons can move quickly without colliding with any impurities because the GaAs layer is undoped, and from which they cannot escape. The effect of this is to create a very thin layer of highly mobile conducting electrons with very high concentration, giving the channel high electron mobility. This layer is called a two-dimensional electron gas.

Referring to FIG. 7, the flowchart comprises an optical signal 1, a photodiode 2, a mixer 3, a local oscillation signal 4, a band pass filter 5, an amplifier transmission link 6, and a radio frequency signal 7. HEMT is a useful device to combine fiber system and radio communication system. When the HEMT is illuminated by light, the channel layer can absorb the optical signal. There are two types of the photoresponse. One type is referred to photovoltaic effect, whereas the other type is referred to photoconduction effect. The modulating optical signal illuminates into the device, the device can mix the local oscillation signal 4 and the modulating optical signal. Meanwhile, we can integrate the detector and mixer into one device to simplify the whole design. Then, we can also integrate far end microwave transmission system into a chip to lower the cost of the optical-microwave network, and indirectly make fiber to the home (FTTH) and fiber to the building (FTTB) become possible.

Referring to FIG. 8, the conventional gate metal is Ti/Au (20 nm/190 nm). The conventional gate metal is illuminated by −9 dBm to 0 dBm, 1.55 μm single mode laser. The bias point, Vd, equals to 0.45V at the most sensitive position to the light wave. The conventional gate metal exists high difficulty in mixing technology and has poor mixing efficiency and high cost. Thus, the need for improvement still exists.

SUMMARY OF THE INVENTION

It is therefore the first object of the invention to provide a multi-layer structure with a transparent gate comprising a MHEMT device structure comprising a GaAs substrate, a Schottky layer and a cap layer formed on the Schottky layer; a transparent gate formed on the Schottky layer is an indium tin oxide, ITO; and a drain and a source formed on the cap layer.

The second object of the invention is to provide a multi-layer structure with a transparent gate is a transparent-gate HEMT using indium tin oxide which can make HEMT being more sensitive to the light wave.

The third object of the invention is to provide a multi-layer structure with a transparent gate which can lower the mixing difficulties. When it is used as a mixer or optical detector, it can increase the mixing efficiency and decrease the network cost.

The above and other objects, features and advantages of the invention will become apparent from the following detailed description taken with the accompanying drawings.

DETAILED DESCRIPTION OF THE INVENTION

Figure 1:
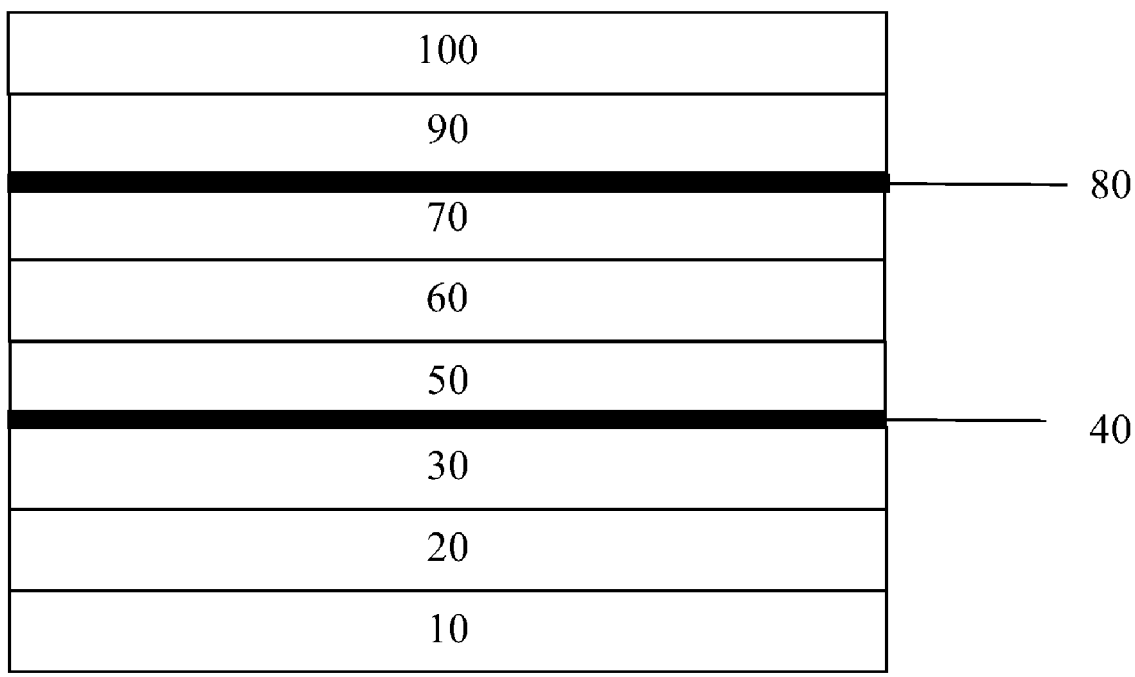
FIG. 1 is a partial sectional view showing a multi-layer structure in accordance with the present invention.

Referring to FIGS. 1 to 6, the invention provides a multi-layer structure with a transparent gate comprising: a MHEMT device structure comprising a GaAs substrate 10, a Schottky layer 90 and a cap layer 100 formed on the Schottky layer 90; a transparent gate 110 formed on the Schottky layer 90 is an indium tin oxide, ITO; and a drain 120 and a source 130 formed on the cap layer 100.

The MHEMT device structure comprises a graded buffer layer 20, a buffer layer 30, a first spacer layer 50, a channel layer 60 and a second spacer layer 70 formed between the GaAs substrate 10 and the Schottky layer 90 in a stacked fashion.

The MHEMT device structure comprises a first planar doping layer 40 formed between the buffer layer 30 and the first spacer layer 50.

The MHEMT device structure comprises a second planar doping layer 80 formed between the second spacer layer 70 and the Schottky layer 90.

The channel layer 60 is of InGaAs.

The graded buffer layer 20 and the buffer layer 30 are of $In_xAl_{1-x}As$ and x is in the range between 0.01 and 0.5.

The cap layer 100 is of InGaAs.

The drain 120 and the source 130 are selected from titanium, gold, nickel, palladium, or platinum.

The drain 120 and the source 130 are selected from a mixture consisting of at least two of titanium, gold, nickel, palladium, and platinum.

The invention utilizes the chemical beam epitaxy growth technique on the GaAs substrate 10. The invention uses the transparent indium tin oxide (ITO) to take the place of conventional gate metal (Ti/Au). The graded buffer layer 20 is a $In_xAl_{1-x}As$ buffer layer, where x is the mole fraction of In content in the graded buffer layer 20, and x is in the range between 0.01 and 0.5. The buffer layer 30 is formed on the graded buffer layer 20. The first planar doping layer 40 is formed on the buffer layer 30. The first spacer layer 50 is formed on the first planar doping layer 40. The channel layer 60 is formed on the first spacer layer 50. The second spacer layer 70 is formed on the channel layer 60. The second planar doping layer 80 is formed on the second spacer layer 70. The Schottky layer 90 is formed on the second planar doping layer 80. The cap layer 100 is formed on the Schottky layer 90.

The buffer layer 30 is an undoped $In_{0.5}Al_{0.5}As$ buffer layer. The first spacer layer 50 is an undoped $In_{0.5}Al_{0.5}As$ spacer layer. The channel layer 60 is a Si doping $In_{0.7}Ga_{0.3}As$ channel layer. The Schottky layer 90 is an undoped $In_{0.5}Al_{0.5}As$ Schottky layer. The cap layer 100 is a Si doping $In_{0.52}Ga_{0.48}As$ cap layer.

Figure 2:
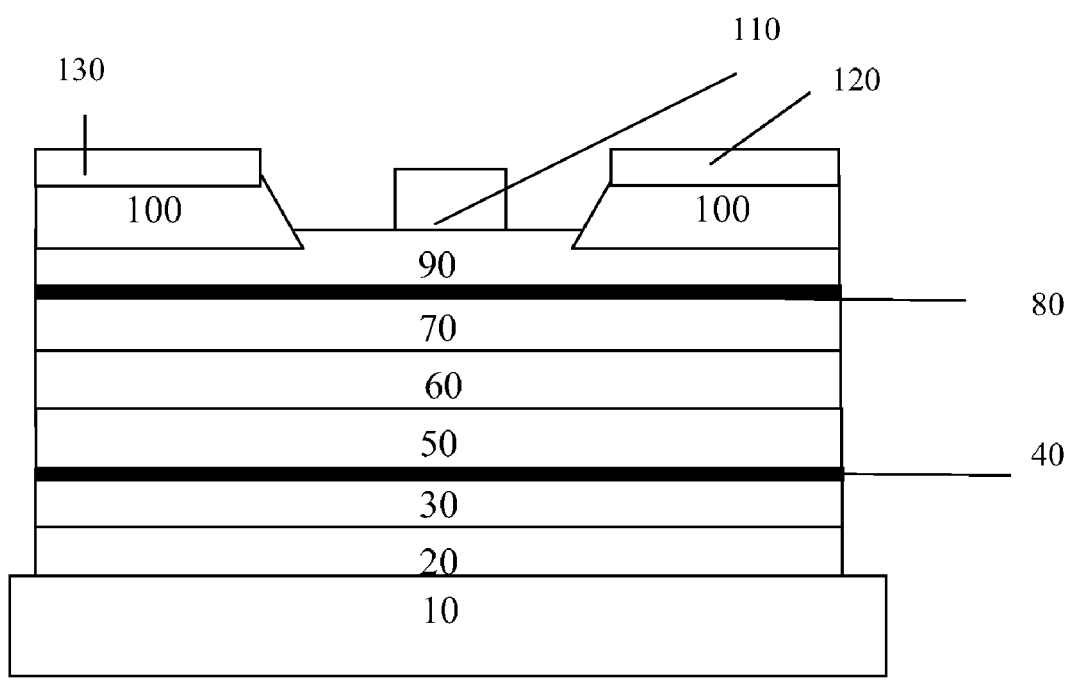
FIG. 2 is a sectional view showing the multi-layer structure with a transparent gate of the invention.

Referring to FIG. 2, the MHEMT device structure comprises the transparent gate 110 on the Schottky layer 90 and the drain 120 and the source 130 formed on the cap layer 100. Two-dimensional electron gas in the MHEMT exists in the quantum well formed by the channel layer. The generation of the electron comes from the first planar doping layer 40 and the second planar doping layer 80. The electron passes through the first spacer layer 50 and the second spacer layer 70 to the channel layer 60. The Schottky layer 90 on the second planar doping layer 80 can improve the Schottky barrier. Besides, the cap layer 100 can improve the ohmic contact resistivity.

The invention sputters the ITO to the MHEMT device, using ITO as the gate metal. The length of the transparent gate is 1 μm. The distance between the drain 120 and the source 130 is 5 μm. Then, we utilize the optic probe to illuminate 1.55 μm single mode laser to measure the optical sensitivity of the MHEMT device.

Figure 3:
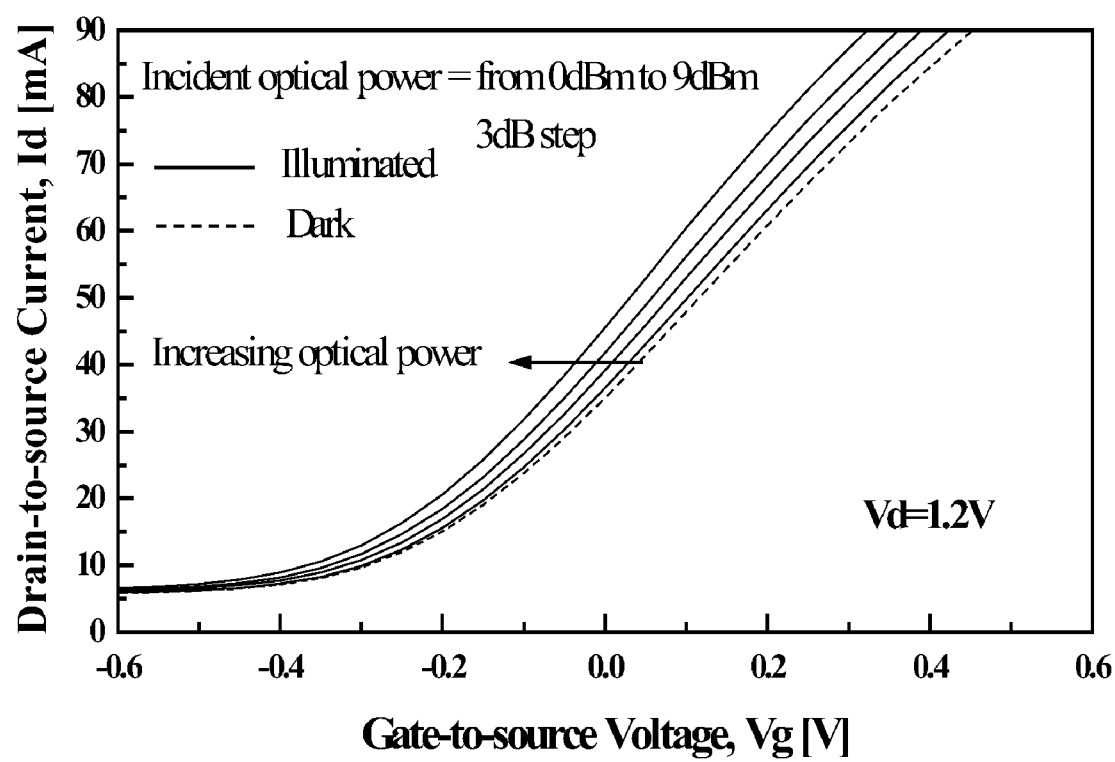
FIG. 3 is a diagram of optical characteristics of the transparent gate in accordance with the present invention.
Figure 8:
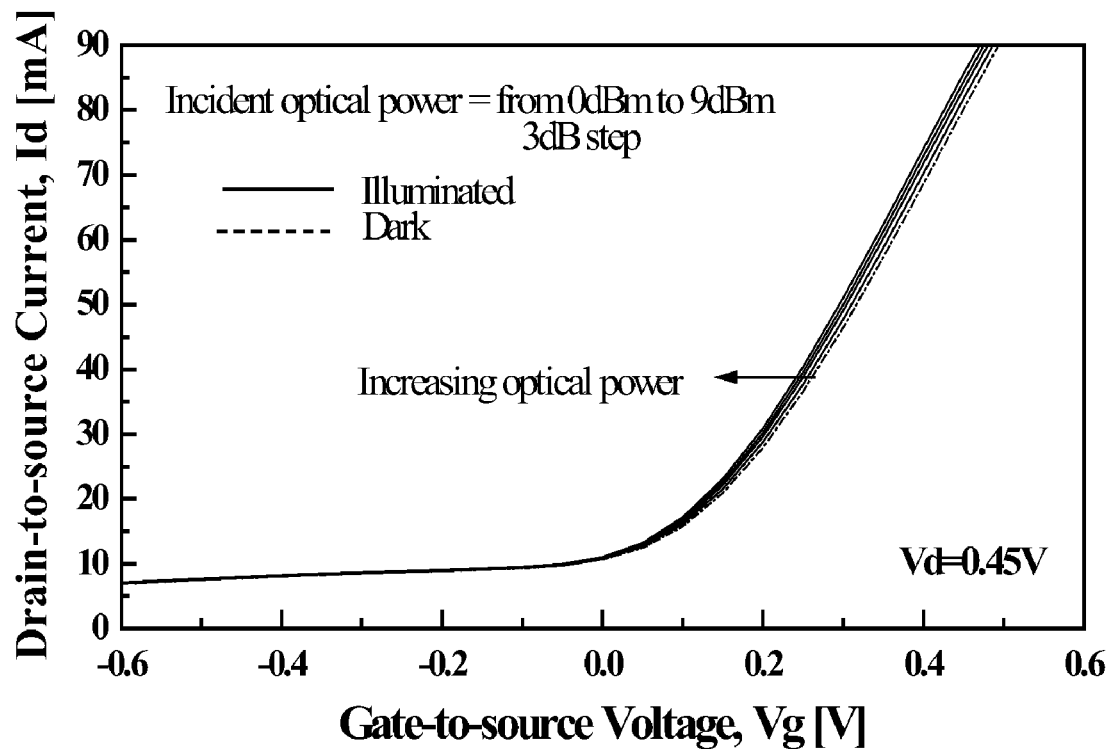
FIG. 8 is a diagram of optical characteristics of conventional gate metal.

The transparent gate 110 is conductive ITO (200 nm). Owing to The transparent gate is transparent, we also call it Transparent Gate-HEMT (Tg-HEMT). The conventional gate metal is Ti/Au (20 nm/190 nm). The conventional gate metal is illuminated by −9 dBm to 0 dBm, 1.55 μm single mode laser. The bias point, Vd, equals to 0.45V at the most sensitive position to the light wave (as shown in FIG. 8). However, according to the Tg-HEMT, Vd is 1.2V. Referring to FIG. 3, Tg-HEMT is significantly more sensitive to light wave.

The planar current density of the MHEMT device is $3.7 \times 10^{12}$ $cm^{-2}$ at room temperature. The hall mobility is 5830 $cm^2$/V-s. The sheet resistance of the sputtered ITO thin film is 89 ohms/sq, and the resistivity is $6.6 \times 10^{-4}$ ohms·cm. When the length of the light is 1.55 μm, the transmittance is 83% and the reflectivity is 10%. We also combine Ti (5 nm)/Au (5 nm)/ITO (190 nm) thin film to measure the transmittance. The transmittance of the Ti (5 nm)/Au (5 nm)/ITO (190 nm) thin film is only 27%.

Figure 4:
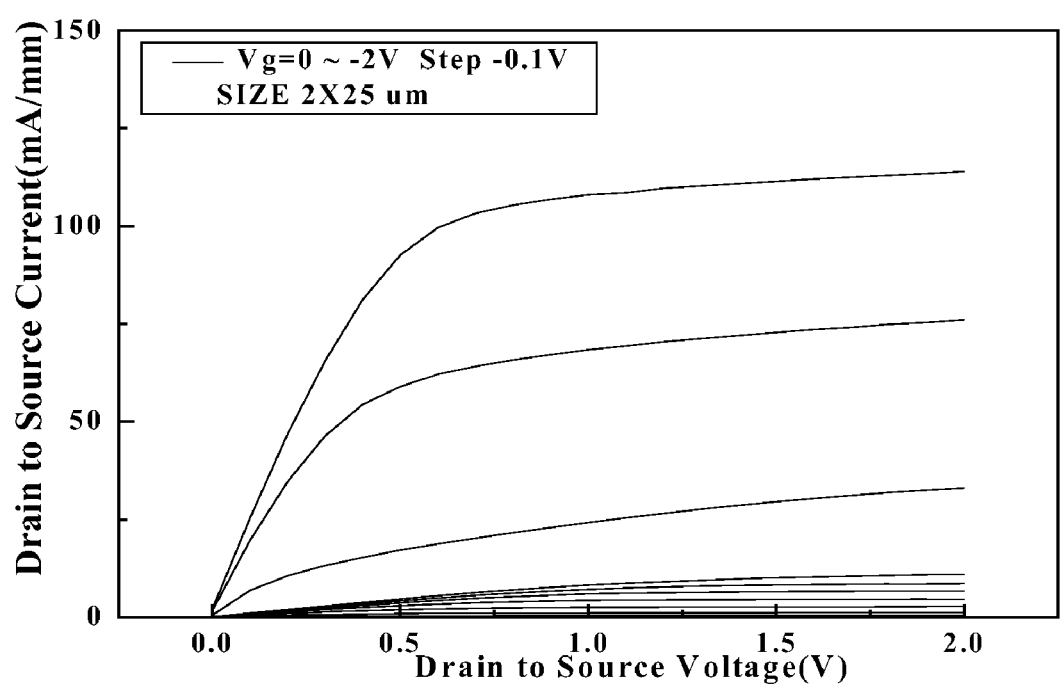
FIG. 4 is a diagram of Current-voltage (I-V) characteristics of the transparent gate of the invention.

Referring to FIG. 4, the result shows Current-Voltage (I-V) characteristics of the transparent gate 110 of the invention. Applied voltage to the transparent gate 110 is from 0V to −2.5V, and each step is −0.1V. Applied voltage to the drain 120 is from 0V to 3V.

Figure 5:
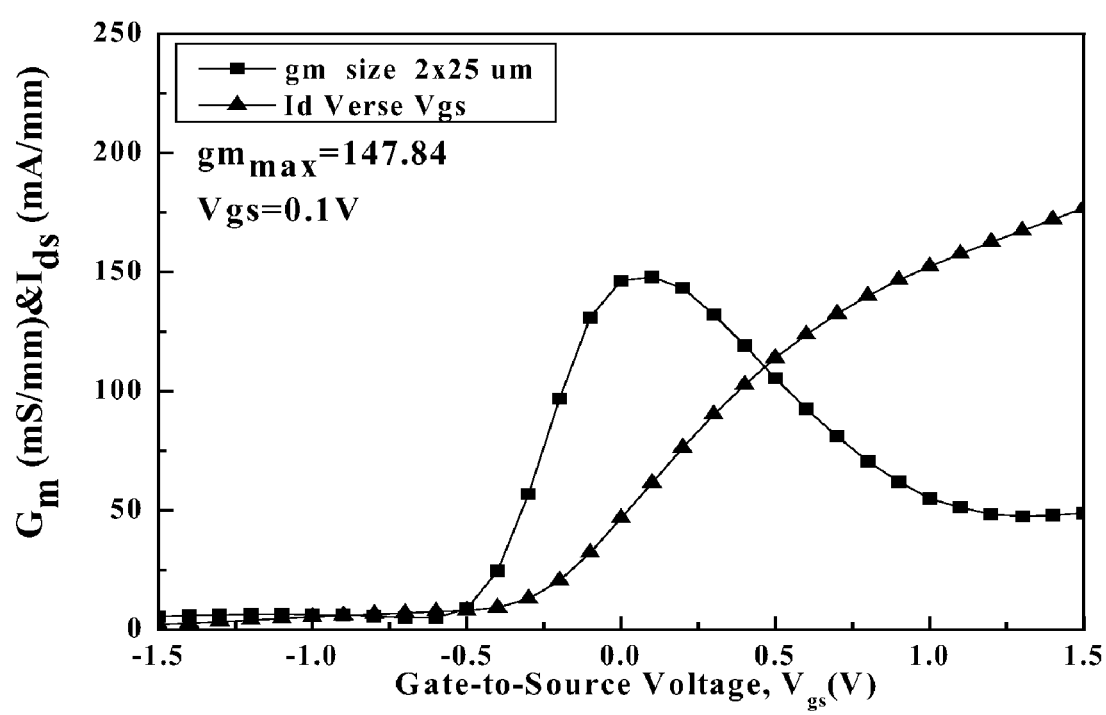
FIG. 5 is a diagram of Gm and Id characteristics of the transparent gate of the invention.

Referring to FIG. 5, the result shows Gm and Id characteristics of the transparent gate 110 of the invention. Applied voltage to the transparent gate 110 is from −3V to 2V. Applied voltage to the drain 120 is 2V.

Figure 6:
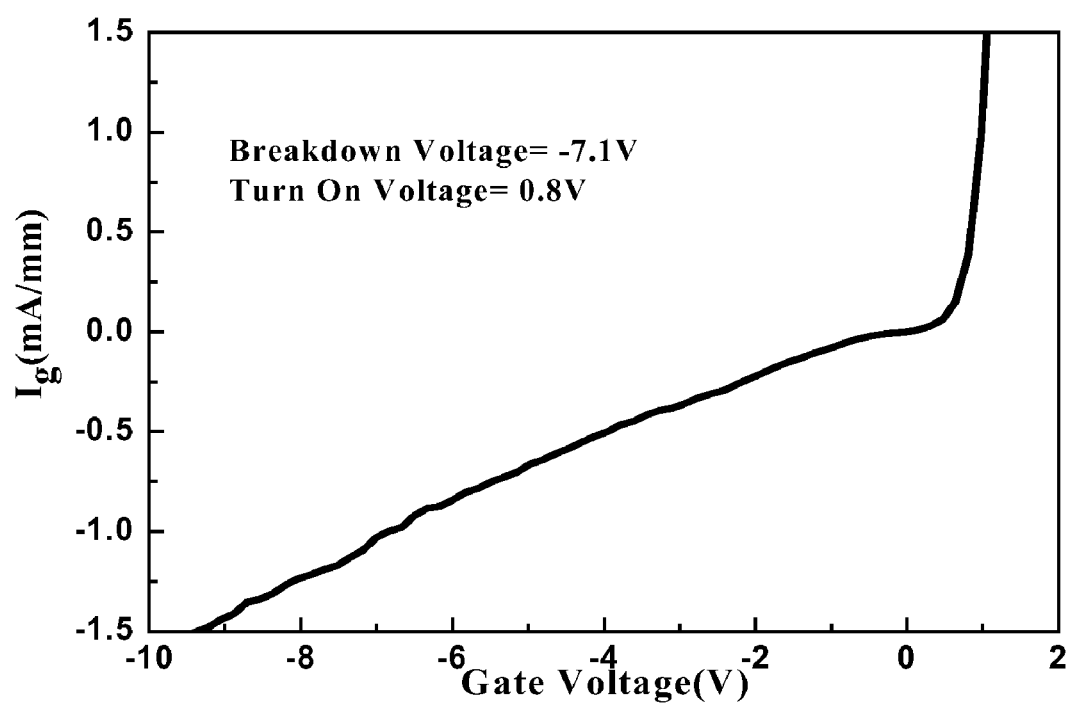
FIG. 6 is a diagram of Schottky characteristics of the transparent gate of the invention.
Figure 7:
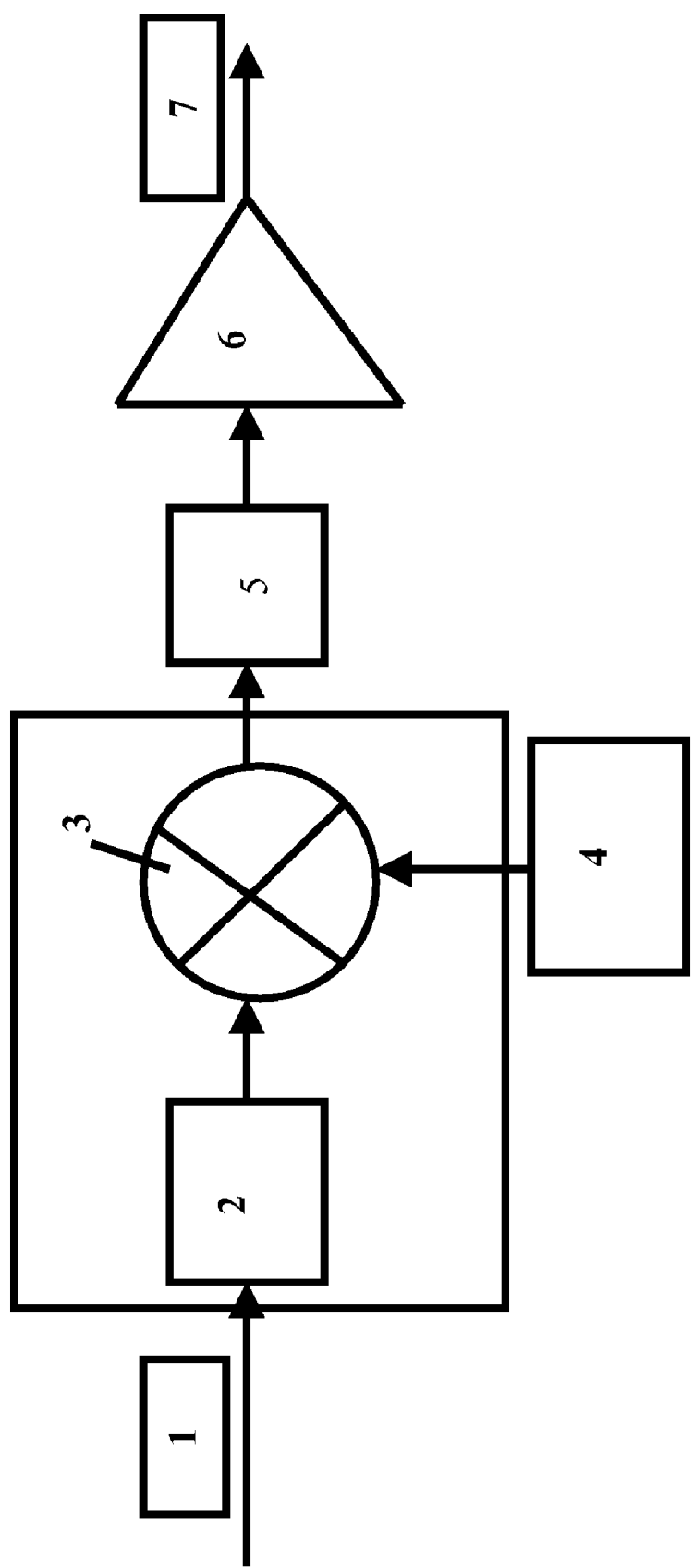
FIG. 7 is a block diagram of conventional optoelectronic microwave mixer.

Referring to FIG. 6, the result shows Schottky characteristics of the transparent gate 110 of the invention. The starting voltage of the transparent gate 110 is 0.8V. The breakdown voltage of the transparent gate 110 is −7.1V. Due to the epitaxial defects of the substrate, it has a leakage current.

While the invention herein disclosed has been described by means of specific embodiments, numerous modifications and variations could be made thereto by those skilled in the art without departing from the scope and spirit of the invention set forth in the claims.

What is claimed is:

1. A multi-layer structure comprising:
    a MHEMT device structure comprising a GaAs substrate, a Schottky layer, and a cap layer formed on the Schottky layer;
    a transparent gate formed on the Schottky layer and being an indium tin oxide;
    a drain and a source formed on the cap layer; and
    the MHEMT device structure comprises a graded buffer layer, a buffer layer, a first spacer layer, a channel layer, and a second spacer layer formed between the GaAs substrate and the Schottky layer in a stacked fashion.

2. The multi-layer structure as claimed in claim 1, wherein the MHEMT device structure comprises a first planar doping layer formed between the buffer layer and the first spacer layer.

3. The multi-layer structure as claimed in claim 1, wherein the MHEMT device structure comprises a second planar doping layer formed between the second spacer layer and the Schottky layer.

4. The multi-layer structure as claimed in claim 1, wherein the channel layer is of InGaAs.

5. The multi-layer structure as claimed in claim 1, wherein the graded buffer layer and the buffer layer are of $In^xAl^{1-x}As$ and x is in the range between 0.01 and 0.5.

6. The multi-layer structure as claimed in claim 1, wherein the cap layer is of InGaAs.

7. The multi-layer structure as claimed in claim 1, wherein the drain and the source are selected from a group consisting of titanium, gold, nickel, palladium, and platinum.

8. The multi-layer structure as claimed in claim 1, wherein the drain and the source are selected from a mixture consisting of at least two of titanium, gold, nickel, palladium, and platinum.

* * * * *